United States Patent
Han

(10) Patent No.: US 8,202,757 B2
(45) Date of Patent: *Jun. 19, 2012

(54) IMAGE SENSOR AND METHOD FOR MANUFACTURING THE SAME

(75) Inventor: Chang Hun Han, Icheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/501,341

(22) Filed: Jul. 10, 2009

(65) Prior Publication Data

US 2010/0025801 A1 Feb. 4, 2010

(30) Foreign Application Priority Data

Jul. 29, 2008 (KR) ................ 10-2008-0074150

(51) Int. Cl.
*H01L 21/00* (2006.01)
*H01L 21/44* (2006.01)
*H01L 21/311* (2006.01)
*H01L 31/062* (2012.01)
*H01L 31/113* (2006.01)

(52) U.S. Cl. .......... 438/98; 438/599; 438/675; 438/696; 257/291

(58) Field of Classification Search .............. 438/48, 438/57, 59, 60, 69, 71, 73–79, 83, 93, 94, 438/98, 598, 599, 602–606, 618, 621, 666, 438/669, 672, 674, 675, 694–696, 718–721, 438/700, 701; 257/257, 291–293
See application file for complete search history.

(56) References Cited

U.S. PATENT DOCUMENTS

| | | |
|---|---|---|
| 6,852,597 B2 * | 2/2005 | Park et al. ............ 438/268 |
| 2004/0041224 A1 * | 3/2004 | Chao et al. ........... 257/444 |
| 2005/0280068 A1 * | 12/2005 | Wang et al. ........... 257/314 |
| 2009/0258488 A1 * | 10/2009 | Kim et al. ............ 438/622 |
| 2009/0286347 A1 * | 11/2009 | Kim et al. ............. 438/72 |

* cited by examiner

*Primary Examiner* — Charles Garber
*Assistant Examiner* — Calvin Choi
(74) *Attorney, Agent, or Firm* — The Law Offices of Andrew D. Fortney; Andrew D. Fortney; Bradley J. Levang

(57) ABSTRACT

An image sensor includes readout circuitry on a first substrate, a metal line electrically connected with the readout circuitry, a dielectric on the metal line, an image sensing device on the dielectric, including first and second conductivity type layers, a contact plug in a via hole penetrating the image sensing device to connect the first conductivity type layer with the metal line, and a sidewall dielectric in the via hole at a sidewall of the second conductivity type layer.

19 Claims, 8 Drawing Sheets

IMAGE SENSOR AND METHOD FOR MANUFACTURING THE SAME

This application claims the benefit of the Korean Patent Application No. 10-2008-0074150, filed on 29 Jul. 2008, which is hereby incorporated by reference as if fully set forth herein.

BACKGROUND OF THE INVENTION

1. Field of the Invention

The present invention relates to an image sensor and a manufacturing method for the same.

2. Discussion of the Related Art

Generally, image sensors refer to a semiconductor device that converts an optical image to an electric signal, and may be classified as charge coupled devices (CCD) or complementary metal oxide semiconductor (CMOS) image sensors (CIS).

According to a conventional method, a photodiode is formed in a semiconductor substrate through ion implantation. However, as the size of the photodiode is gradually reduced to increase the number of pixels without increasing the chip size, a proportion of the light receiving area (that is, a fill factor) is decreased, which may result in deterioration of the image quality.

Furthermore, an airy disk, which is a phenomenon caused by diffraction of light, may occur when a stack height is not reduced as much as the decreased light receiving area. Accordingly, the number of photons incident to the light receiving parts tends to be reduced.

In order to overcome these problems, the material for the photodiode may be vapor-deposited using amorphous silicon (Si). Alternatively, the readout circuitry may be formed on a Si semiconductor wafer, while the photodiode is formed on a separate wafer, which is bonded to the readout circuitry wafer by wafer-to-wafer bonding at an upper part of the readout circuitry. Such a structure will be referred to herein as a 3D image sensor. The photodiode and the readout circuitry are connected through a metal line.

According to the conventional structure, a short may occur in the photodiode due to a contact plug connecting the readout circuitry with the photodiode.

Additionally, in the conventional structure, charge sharing may be caused since a source and a drain at terminals of a transfer transistor are both heavily doped (e.g., with N-type dopants). Occurrences of charge sharing can deteriorate sensitivity of output images or even generate image errors.

Moreover, photocharges may not be smoothly transferred from the photodiode to the readout circuitry in the conventional structure, thereby causing a dark current, or deteriorating saturation and sensitivity.

SUMMARY OF THE INVENTION

Accordingly, the present invention is directed to an image sensor and a method for manufacturing the same that substantially obviate one or more problems due to limitations and disadvantages of the related art.

An object of the present invention is to provide an image sensor capable of restraining an electric short from occurring in a contact plug that connects readout circuitry to an image sensing device, and a manufacturing method thereof.

Another object of the present invention is to provide an image sensor capable of improving a fill factor without causing charge sharing, and a manufacturing method thereof.

A further object of the present invention is to provide an image sensor that minimizes a dark current source by providing a path for smooth movement of photocharges from a photodiode to the readout circuitry and that prevents deterioration of saturation and sensitivity, and a manufacturing method thereof.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose(s) of the invention, as embodied and broadly described herein, an image sensor comprises readout circuitry on a first substrate, a metal line electrically connected with the readout circuitry in or under a first dielectric layer on or over the first substrate, a second dielectric layer on the metal line, an image sensing device on the second dielectric layer, the image sensing device including a first conductivity type layer and a second conductivity type layer, a contact plug in a via hole penetrating the image sensing device to connect the first conductivity type layer with the metal line, and a sidewall dielectric in the via hole at a sidewall of the second conductivity type layer.

In another aspect of the present invention, a method for manufacturing an image sensor includes forming readout circuitry on a first substrate, forming a first dielectric layer on or over the first substrate, forming a metal line on or in the first dielectric layer in electrical connection with the readout circuitry, forming a second dielectric layer on the metal line, forming an image sensing device on or over the second dielectric layer, the image sensing device including a first conductivity type conduction layer and a second conductivity type conduction layer, forming a first via hole partially penetrating the image sensing device, forming a sidewall dielectric on a sidewall of the first via hole, forming a second via hole exposing the metal line in connection with the first via hole using the sidewall dielectric as an etching mask, and forming a contact plug in the second via hole to connect the first conductivity type conduction layer with the metal line.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE INVENTION

Reference will now be made in detail to preferred embodiments of the present invention, examples of which are illustrated in the accompanying drawings. Wherever possible, the same reference numbers will be used throughout the drawings to refer to the same or like parts.

It will be understood that when an element such as a layer is referred to as being "on" or "under" another element, the element may be disposed "directly" on another element or "indirectly," by having one or more interposing elements between them.

Also, the present invention is not limited to complementary metal oxide semiconductor (CMOS) sensors, but may include any image sensors requiring a photodiode.

Embodiment 1

Figure 1:
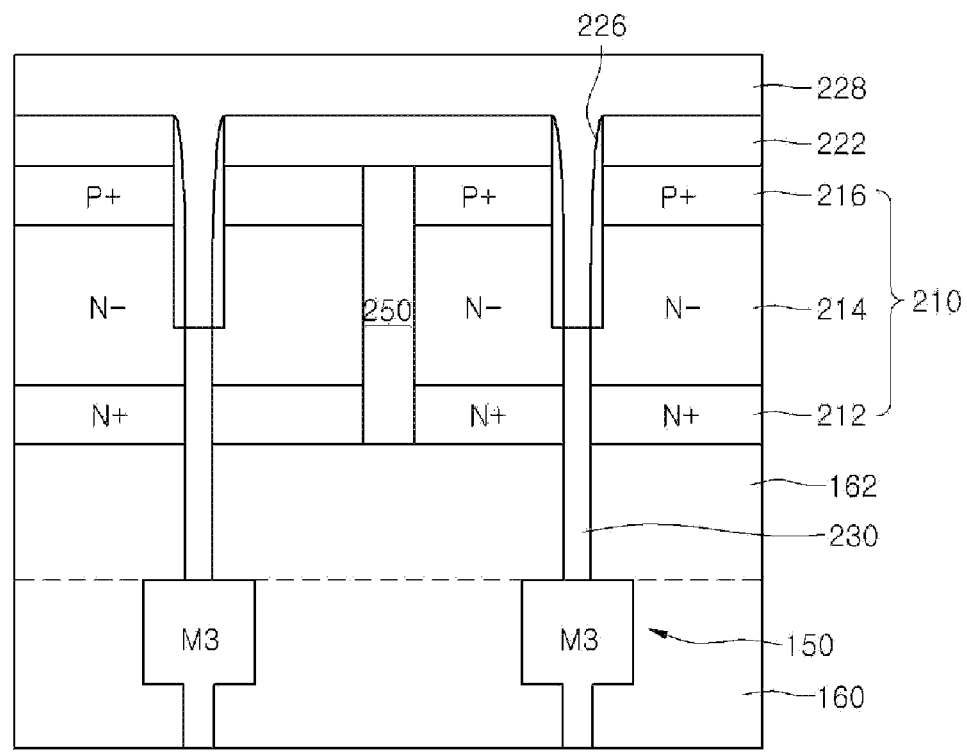
FIG. 1 is a sectional view of an exemplary image sensor according to a first embodiment of the present invention.

FIG. 1 is a sectional view of an exemplary image sensor according to a first embodiment of the present invention.

The image sensor comprises readout circuitry 120 (FIG. 3) formed on a first substrate 100, a metal line 150 electrically connected with the readout circuitry 120 in one or more first interlayer dielectrics 160 formed on the first substrate 100, a second interlayer dielectric 162 formed on the metal line 150, an image sensing device 210 (FIG. 1) formed on the second interlayer dielectric 162, including a first conductivity type layer 214 and a second conductivity type layer 216, a contact plug 230 formed in a via hole penetrating the image sensing device 210, thereby connecting the first conductivity type layer 214 with the metal line 150, and a sidewall dielectric 226 formed in the via hole at a sidewall of at least the second conductivity type layer 216.

The image sensing device 210 may be a photodiode and, not being limited to the photodiode, may also be a photo gate or a combination of a photodiode and a photo gate. Although the present embodiment is explained as an example where the photodiode is formed in a crystalline semiconductor layer, the photodiode may be formed in an amorphous semiconductor layer according to other embodiments of the present invention.

Hereinafter, a method for manufacturing the image sensor according to various embodiments will be described with reference to FIG. 2 to FIG. 12.

Figure 2:
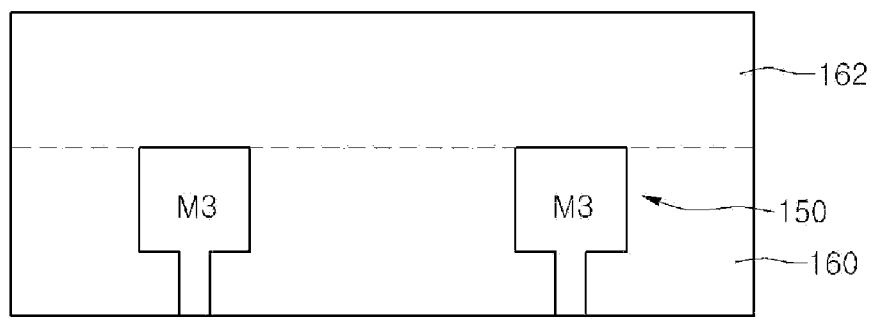
FIGS. 2 through 12 are sectional views illustrating exemplary structures formed during exemplary processes for manufacturing the image sensor according to embodiments of the present invention.
Figure 3:
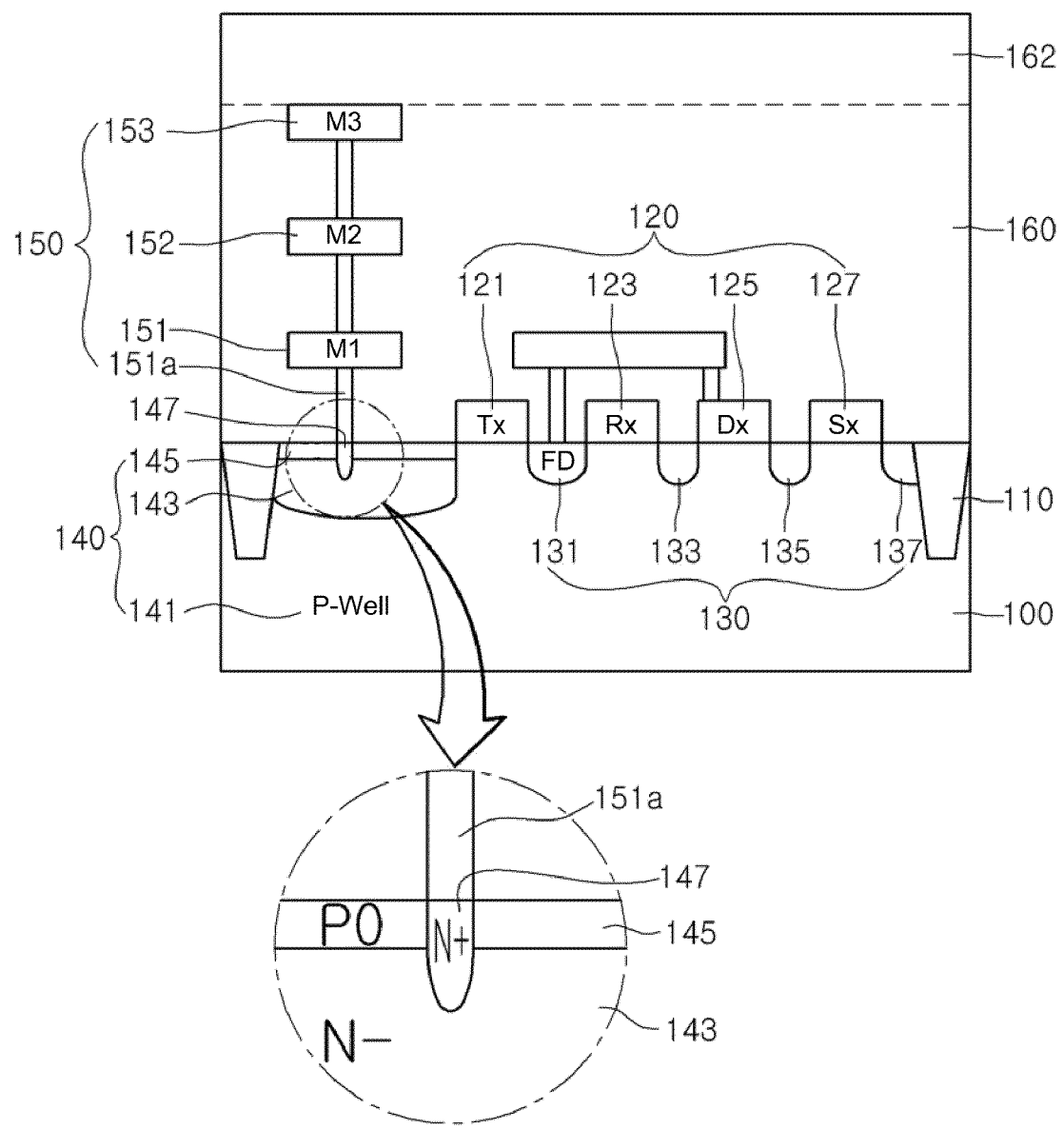

FIG. 2 shows an embodiment in which a metal line 150 (which may comprise a dual damascene copper interconnection) may be connected to the readout circuitry. FIG. 3 is a detailed embodiment that may incorporate the embodiment of FIG. 2. The following description will be made referring to FIG. 3.

As shown in FIG. 3, a device isolation layer 110 is formed in the first substrate 100 thereby define an active region. The substrate 100 may have a second conductivity type (e.g., P type). Readout circuitry 120 including one or more transistors is formed in the active region. For example, the readout circuitry 120 may include a transfer transistor Tx 121, a reset transistor Rx 123, a drive transistor Dx 125, and a select transistor Sx 127. Next, an ion implantation region 130 including a floating diffusion region FD 131 and source/drain regions 133, 135 and 137 may be formed in the substrate 100 for the respective transistors.

According to one embodiment, the manufacturing method may include steps of forming an electrical junction area 140 in the first substrate 100 (e.g., adjacent to the transfer transistor Tx 121), and forming a first conductivity type (e.g., N-type) connection region 147 in an upper part of the electrical junction area 140 in connection with the metal line 150. The electrical junction area 140 may be or comprise a P-N junction, although it is not limited thereto. For example, the electrical junction area 140 may include a first conductivity type ion implantation layer 143 formed in a second conductivity type well 141 or in a second conductivity type epitaxial layer (not shown), and a second conductivity type ion implantation layer 145 formed on, in or in contact with the first conductivity type ion implantation layer 143. In addition, the P-N junction 140 may be in the form of a P0 145/N− 143/P− 141 junction as shown in FIG. 3, although it is not limited to such an embodiment.

According to such embodiments, full dumping or transfer of photo charge(s) can be achieved by designing the device so that there is a potential difference between the source and drain at both ends of the transfer transistor Tx. Therefore, as the photo charge(s) generated from the photodiode are transferred to the floating diffusion region FD 131, sensitivity of the output image can be enhanced. More specifically, the electrical junction area 140 in the first substrate 100 is configured so that a potential difference exists between the source and drain of the transfer transistor Tx 121 when photo charges are generated, so that the photo charges can be fully transferred to the readout circuitry 120.

The photo charge dumping or transfer structure will now be described in detail.

Differently from the floating diffusion node FD 131, which in one example is an N+ junction, an applied voltage in the P/N/P junction of the electrical junction area 140 may not be fully transmitted, but rather, may be pinched off at a predetermined voltage. This voltage is called a pinning voltage, which depends on the doping concentrations of the P0 layer 145 and the N− layer 143.

To be more specific, an electron generated from the photodiode 210 (see FIG. 1) moves to the P/N/P junction 140, and is transferred to the floating diffusion region FD 131 and converted into a voltage when the transfer transistor Tx 121 is turned on. Since a maximum voltage value of the P0/N−/P− junction 140 is the pinning voltage in the embodiment shown in FIGS. 1 and 3, and a maximum voltage value of the floating diffusion node FD 131 may be a threshold voltage Vth of the reset transistor Rx 123 below an upper operating voltage Vdd (e.g., Vdd−Vth), electrons generated in the photodiode 210 in the upper part of the image sensor chip can be fully transferred to the floating diffusion FD 131 node without causing charge sharing by implementing a potential difference between the source and drain terminals of the transfer transistor Tx 131. That is, the P0/N−/P-well junction instead of an N+/P-well junction may be formed in the first substrate 100 (which in one embodiment is a silicon substrate) to allow a positive voltage to be applied to the N− region 143 of the P0/N−/P-well junction and a ground voltage to be applied to the P0 region 145 and the P-well 141 during a 4-Tr active pixel sensor (APS) reset operation, so that a pinch-off is generated at the P0/N−/P-well double junction at a predetermined voltage (or higher) as in a bipolar junction transistor (BJT) structure, the predetermined voltage generally being or referred to as the pinning voltage. Therefore, a potential difference is generated between the source and the drain at the ends of the transfer transistor Tx 121 so that the photo charges are fully transferred from the N-well (e.g., N− region 143) to the floating diffusion region FD 131 through the transfer transistor Tx 121, thereby restraining or preventing charge sharing from occurring during the on/off operations of the transfer transistor Tx 121. Consequently, embodiments of the present invention may effectively avoid deterioration of saturation and sensitivity that used to happen in the conventional structure where the photodiode is connected simply by an N+ junction.

In addition, the first conductivity type connection region 147 may be formed between the photodiode and the readout circuitry 120 to provide a swift movement path for the photo charge(s), so that a dark current source is minimized and the deterioration of saturation and sensitivity reduction is prevented. For this, according to various embodiments, an N+ doping region as the first conductivity type connection region 147 for an ohmic contact may be formed on the surface of the P0/N−/P− junction 140. The N+ region 147 may be formed to contact the N− layer 143 by penetrating the P0 layer 145. In addition, the connection region 147 may be located in the same area as the contact 151*a* and/or have a width substantially the same as contact 151*a*.

Here, for example, the width of the first conductivity type region 147 is minimized in order to restrain or prevent the first conductivity type connection region 147 from becoming a leakage source as much as possible. To this end, for example, plug implant may be formed after etching of the contact hole for the first metal contact 151*a*. However, in another example, an ion implantation pattern (not shown) may be formed and used as an ion implantation mask to produce the first conductivity type connection region 147.

That is, a reason for locally doping only a portion of the P/N/P junction 140 corresponding to contact 151*a* with dopant (e.g., N+ doping) is to facilitate forming the ohmic contact while minimizing a dark signal. In case of doping the entire transfer transistor Tx source with an N+ dopant level as in the conventional art, a dark signal may be increased by the presence of Si surface dangling bond(s).

Next, the first interlayer dielectric 160 may be formed on the first substrate 100, and the metal line 150 may be formed. The metal line 150 may include, but is not limited to, the first metal contact 151*a*, a first metal 151, a second metal 152, and a third metal 153. The second metal 152 and the third metal 153 may be connected to each other and/or to the first metal 151 by contacts similar or identical to the first metal contact 151*a*.

The second interlayer dielectric 162 is formed on the metal line 150, for example, using a dielectric layer such as an oxide layer and/or a nitride layer (e.g., bulk silicon dioxide or fluorosilicate glass [FSG] on a thin layer of silicon nitride). The second interlayer dielectric 162 is provided to improve a bonding force between the first substrate 100 and a second substrate (not shown) having the image sensing device 210.

Figure 4:
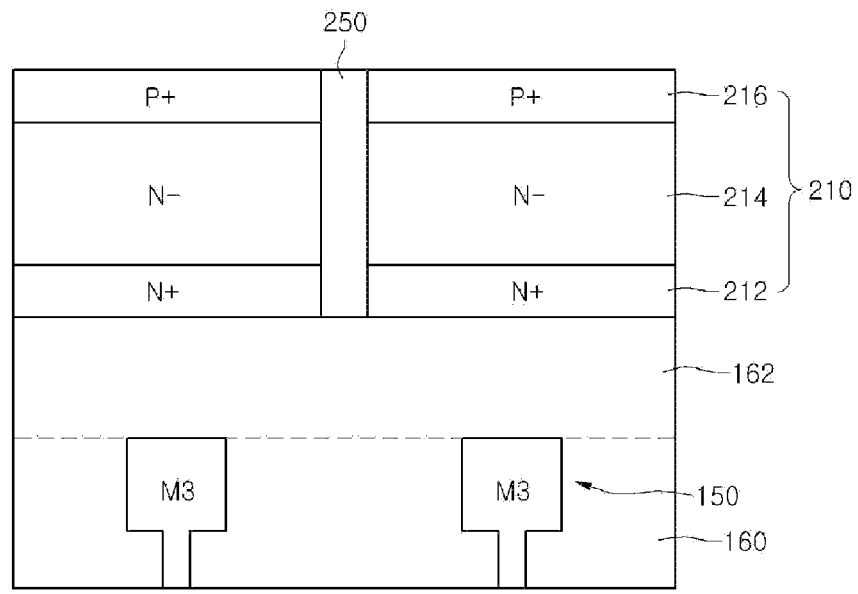

The image sensing device 210 is then formed on the second interlayer dielectric 162. The image sensing device 210 includes at least a first conductivity type conduction layer 214 and a second conductivity type conduction layer 216 as shown in FIG. 4.

For example, a photodiode including the N− layer 214 and the P+ layer 216 may be formed on or in a crystalline semiconductor layer of the second substrate (not shown). The photodiode may further include an N+ layer 212 for improving the ohmic contact (e.g., to/with a subsequently formed plug 230; see, e.g., FIG. 11). According to various embodiments, the charge storing capacity of the photodiode can be increased by increasing the thickness of the first conductivity type conduction layer 214 to a level greater than that of the second conductivity type conduction layer 216. Specifically, the charge storing capacity can be improved by increasing the charge storing area as a result of forming the N− type conduction layer 214 thicker than the P+ conduction layer 216.

Then, patterning and etching the image sensing device 210 to separate each unit pixel may be performed, then the etched portion between the pixels is filled with an interpixel dielectric 250. The interpixel dielectric 250 may also be formed after formation of the contact plug 230.

Figure 5:
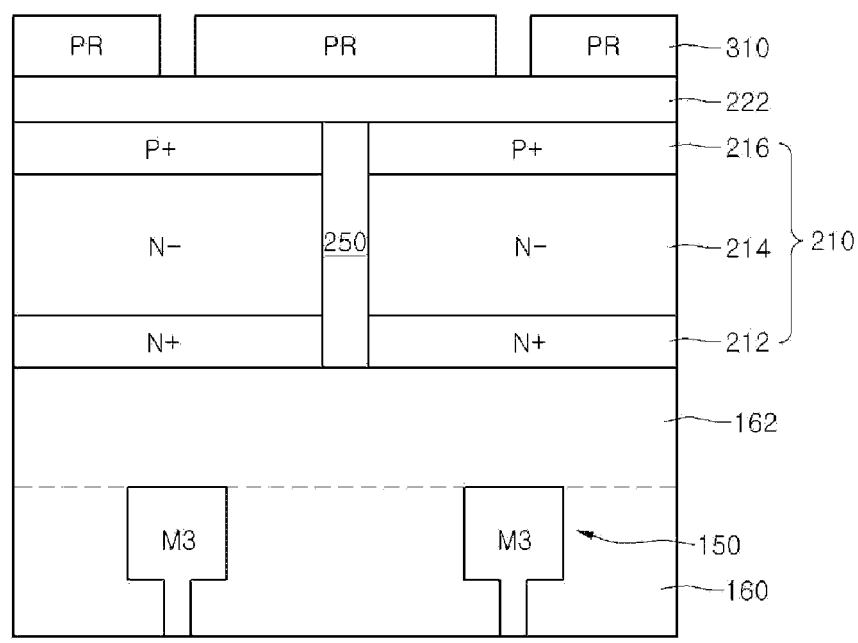
Figure 6:
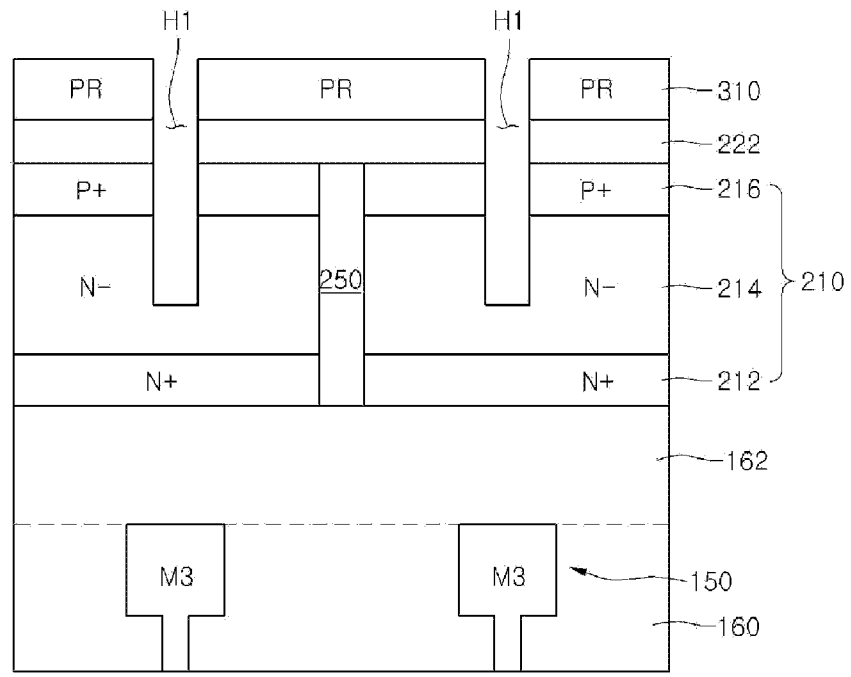

Next, referring to FIG. 5, a first dielectric layer 222 is formed on the image sensing device 210, and then a photoresist pattern 310 is formed to produce a first via hole H1 (FIG. 6). Here, the first dielectric layer 222 may comprise an oxide layer (e.g., silicon dioxide) or a nitride layer (e.g., silicon nitride), although it is not limited thereto.

As shown in FIG. 6, the first via hole H1 is formed, partially removing the second conductivity type conduction layer 216 of the image sensing device 210. More specifically, the first via hole H1 that exposes the N− conduction layer 214 may be formed by removing an exposed part of the first dielectric layer 222, an exposed part of the P+ conduction layer 216, and at least a partial thickness of an exposed part of the N− conduction layer 214 using the photoresist pattern as an etching mask. The first via hole H1 may thus be formed deeper than the second conductivity type conduction layer 216, but shallower than the first conductivity type conduction layer 214. The etch chemistry for etching the first dielectric layer 222 may be selective or non-selective with regard to the P+ conduction layer 216, and the depth to which the N− conduction layer 214 is etched may be controlled by controlling the length of time that the N− conduction layer 214 and the P+ conduction layer 216 (and, optionally, the first dielectric layer 222) are etched.

Figure 7:
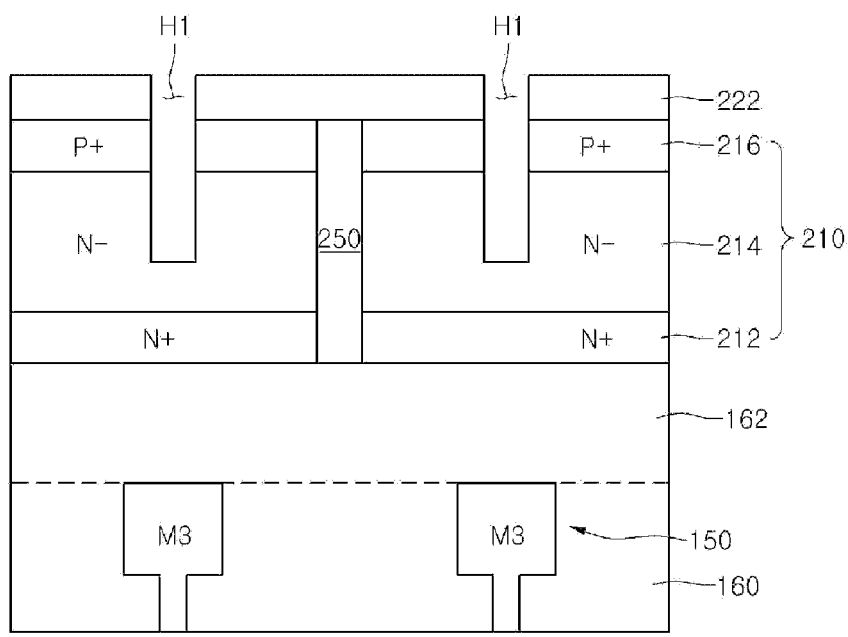

After that, the photoresist pattern 310 is removed as shown in FIG. 7.

Figure 8:
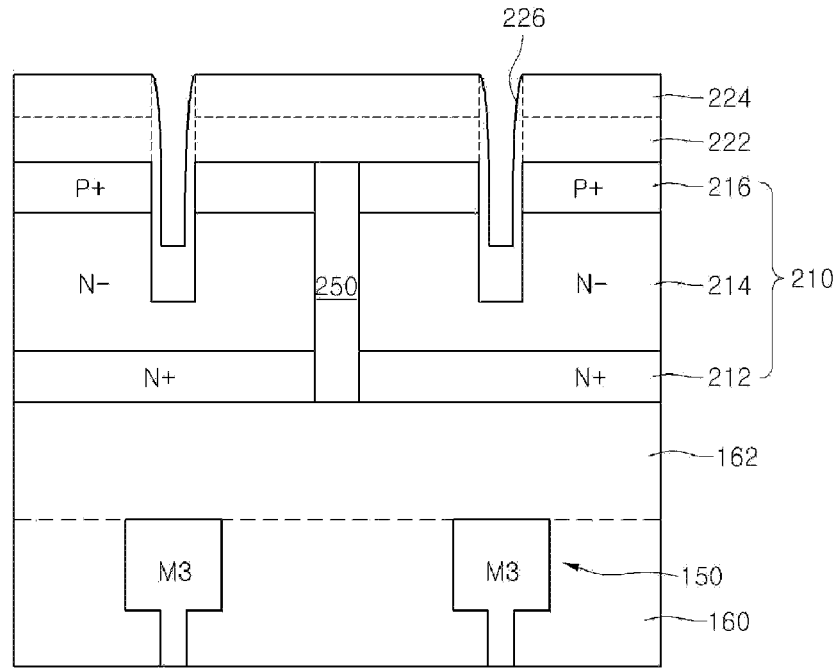

Next, referring to FIG. 8, the sidewall dielectric 226 is formed in the contact hole H1 (e.g., on a sidewall of the second conductivity type conduction layer 216). More specifically, after a second dielectric layer 224 comprising an oxide layer is formed in the first via hole H1 and on the first dielectric layer 222, the sidewall dielectric 226 may be formed at the sidewall of the second conductivity type conduction layer 216 by an entire surface (or anisotropic) etch, for example an etch back process.

Figure 9:
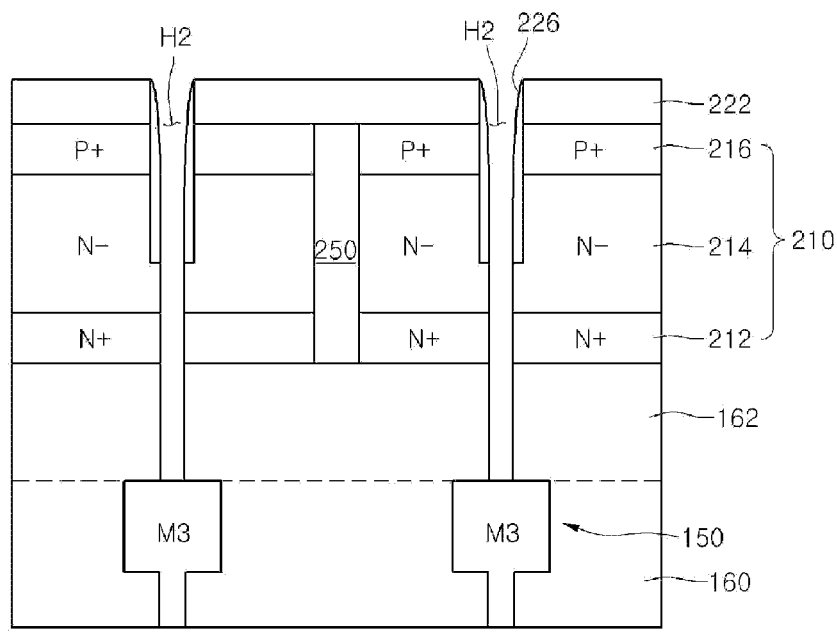

In the embodiment shown in FIGS. 8-9, the sidewall dielectric 226 may also be formed at an upper portion of the sidewall of the N− conductivity type layer 214. The sidewall dielectric 226 may also expose a portion of the N− conductivity type layer 214 at the bottom of the contact hole H1 (not shown).

According to exemplary embodiments of the image sensor and the manufacturing method of the present invention, an electrical short in the contact plug 230 connecting the readout circuit 120 with the image sensing device 210 can be prevented by insulating the contact plug 230 penetrating the image sensing device 210 using the sidewall dielectric 226. Thus, keeping or retaining some thickness of the first dielectric layer 222 may provide some margin for forming a thickness of the sidewall dielectric 226 sufficient to insulate the P+ conduction layer 216 from metal subsequently deposited into the contact hole.

As shown in FIG. 9, next, a second via hole H2 is formed using the sidewall dielectric 226 as an etching mask. The second via hole H2 exposes the metal line 150, and is in connection with the first via hole H1, thereby effectively extending the first via hole H1. The second via hole H2 may be formed to penetrate the image sensing device 210 (or a remaining portion thereof) and the second interlayer dielectric 162, thereby exposing an upper part of the metal line 150.

Figure 10:
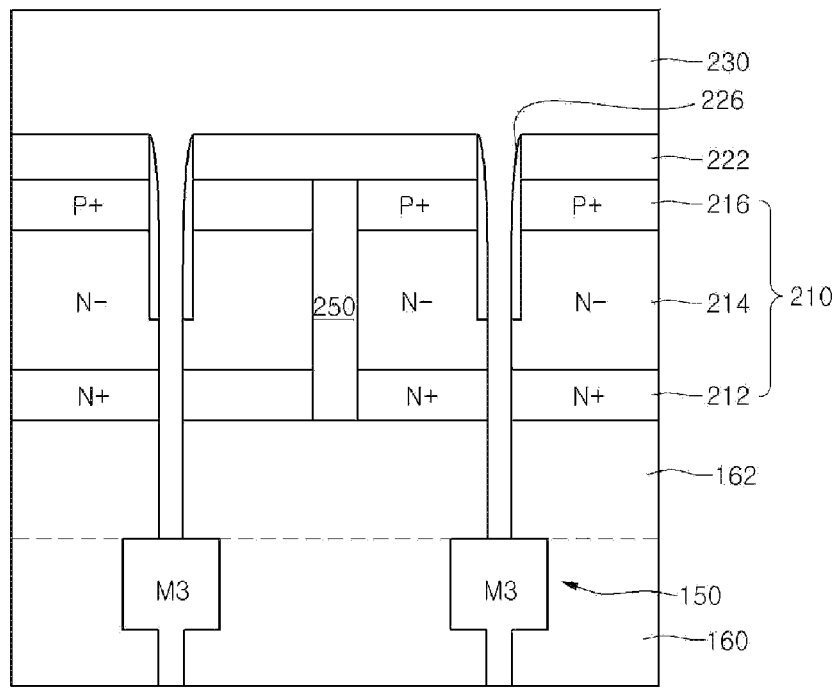

Referring to FIG. 10, the contact plug 230 connecting the first conductivity type conduction layer 214 with the metal line 150 may be deposited into the first and second via holes H1 and H2. For example, one or more metals such as W and Ti (e.g., W deposited by CVD onto a sputtered TiN-on-Ti bilayer stack) may be used for the material of the contact plug 230 filling the second vial hole H2.

Figure 11:
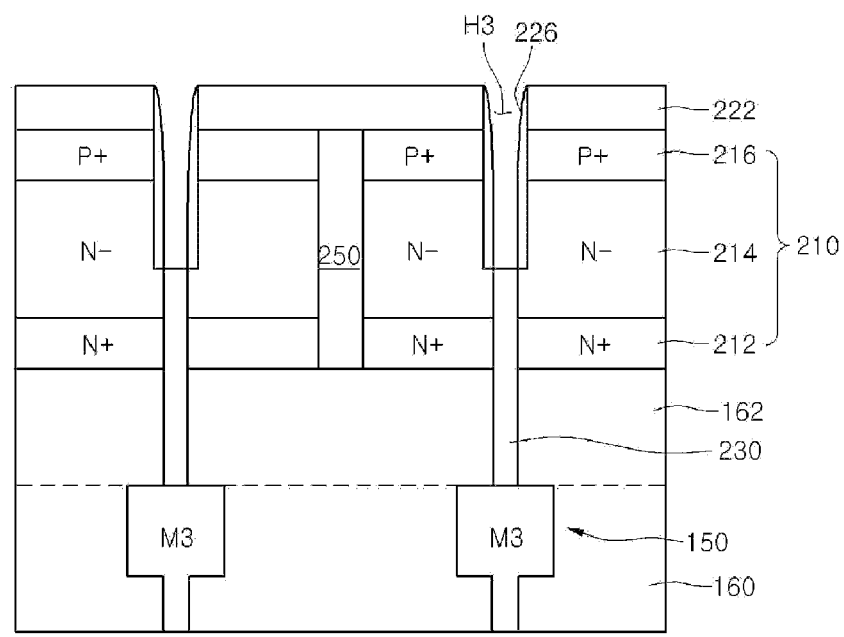

Next, referring to FIG. 11, a third via hole H3 may be formed by removing the contact plug 230 disposed along the sidewall dielectric 226 (e.g., at the second conductivity type conduction layer 216). That is, the contact plug 230 at the P+ conduction layer 216 may be removed, for example, by an entire surface (or anisotropic) etch. If desired, some height of the contact plug 230 may remain in contact with the sidewall dielectric 226, or the contact plug 230 may be etched such that some part of the sidewall of the first conductivity type conduction layer 214 is exposed. In one embodiment (not shown), the material for the contact plug 230 is etched to a depth less than that of the first contact hole H1. The depth of etching the contact plug 230 may be controlled by controlling the length of time that the etch is conducted.

Figure 12:
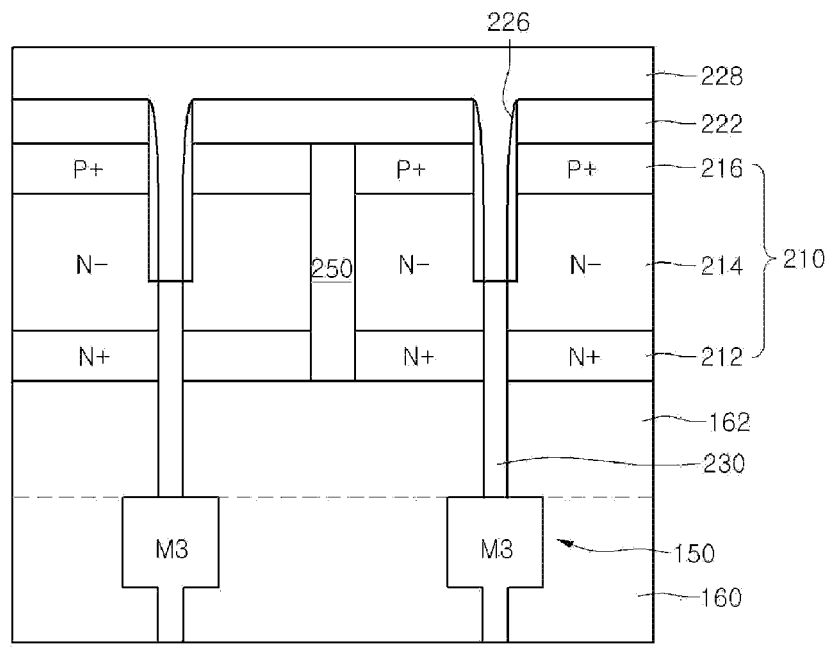

Referring to FIG. 12, a third dielectric layer 228 is deposited in (e.g., by CVD) the third via hole H3. The third dielectric layer 228 may comprise or consist essentially of an oxide layer (e.g., silicon dioxide), and may be in contact with at least an upper portion (or substantially all) of the sidewall dielectric 226.

Afterward, grounding may be performed with respect to the second conductivity type conduction layer 216 (e.g., the second conductivity type conduction layer 216 may be electrically connected to a ground potential or ground plane).

According to embodiments of the present image sensor and manufacturing method, electrical shorts in the contact plug 230 connecting the readout circuit 120 with the image sensing device 210 can be prevented by insulating the contact plug 230 penetrating the image sensing device 210 with the sidewall dielectric 226 (and, optionally the third dielectric layer 228 in the third via hole H3).

Embodiment 2

Figure 13:
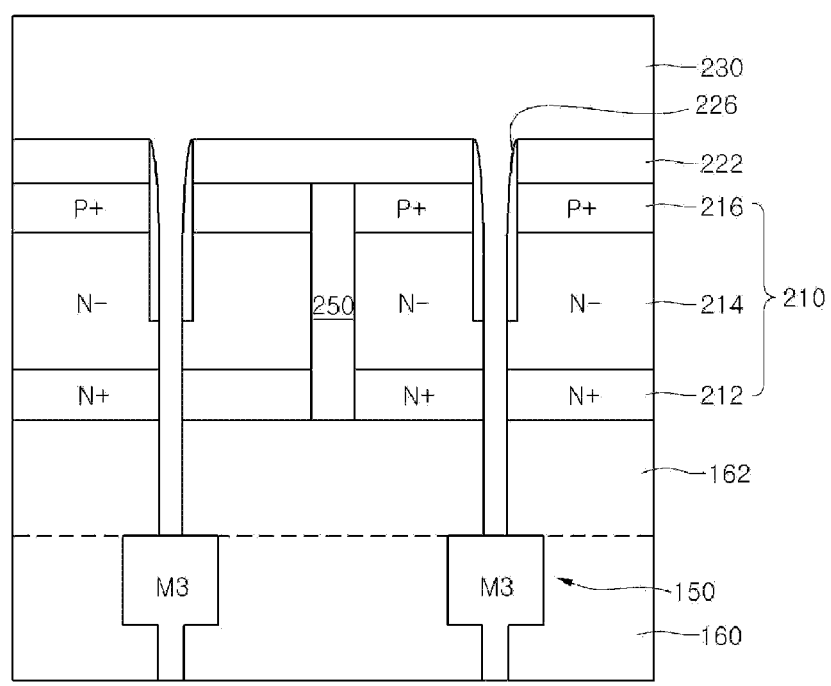
FIG. 13 and FIG. 14 are sectional views illustrating exemplary processes for manufacturing an image sensor according to one or more alternative embodiments of the present invention.
Figure 14:
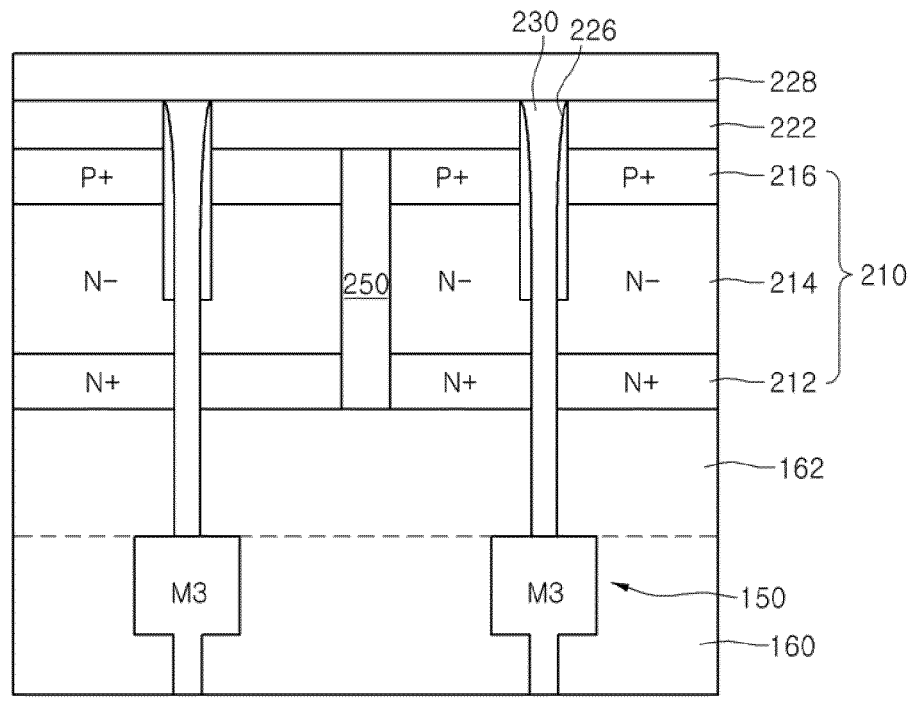

FIG. 13 and FIG. 14 are cross-sectional views of structures in a method to manufacture an image sensor according to an alternative embodiment of the present invention. It is noted that this alternative embodiment may employ technical features of the first embodiment. Therefore, the alternative embodiment will now be explained mainly focusing on the features distinguishing it from the first embodiment.

The processes as described are performed in the process of forming the contact plug 230 in the first and second via holes H1 and H2, as shown in FIG. 13.

In the alternative embodiment, the material for the contact plug 230 deposited on the upper part of the image sensing device 210 (e.g., on first dielectric layer 222, as shown in FIG. 13) is removed (e.g., by chemical mechanical polishing) as shown in FIG. 14, which is a primary difference from the first embodiment. Next, the third dielectric layer 228 is formed on the contact plug 230, and grounding may be performed with the second conductivity type conduction layer 216.

The contact plug 230 and the second conductivity type conduction layer 216 can be electrically insulated by the sidewall dielectric 226 according to the second embodiment. Therefore, electrical shorts can be prevented by removing only the contact plug material 230 on the uppermost surface of the image sensing device 210. Such processing improves the manufacturing efficiency.

Embodiment 3

Figure 15:
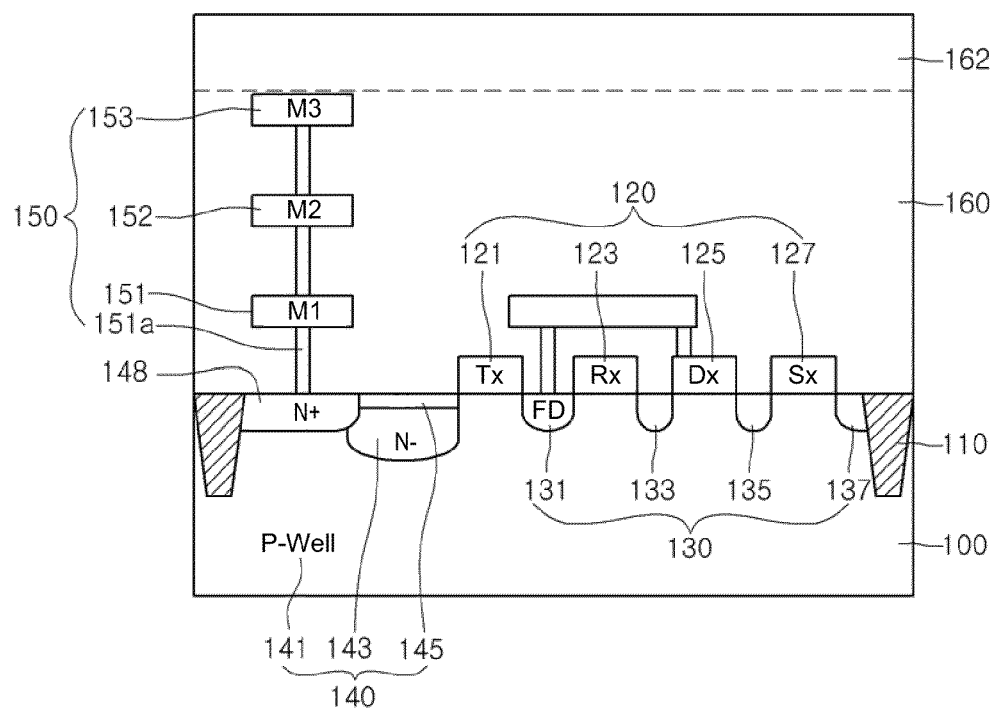
FIG. 15 is a sectional view of an exemplary image sensor according to yet another exemplary embodiment of the present invention.

FIG. 15 is a sectional view of an image sensor according to a further embodiment of the present invention, especially showing the first substrate 100 including the metal line 150 in detail.

The exemplary image sensor includes the readout circuitry 120 on the first substrate 100, the metal line 150 in the first dielectric 160 on the first substrate 100 in electrical connection with the readout circuitry 120, the second dielectric 162 on the metal line 150, an image sensing device 210 (not shown) on the second dielectric 162 including the first and the second conductivity type conduction layers 214 and 216, the contact plug 230 (not shown) in the via hole penetrating the image sensing device 210 and connecting the first conductivity type conduction layer 214 with the metal line 150, and the sidewall dielectric 226 (not shown) in the via hole on the sidewall of the second conductivity type conduction layer 216. This further embodiment may employ technical features of the other embodiments. For example, this embodiment may prevent electrical shorts from occurring at the contact plug 230 which connects the readout circuitry 120 with the image sensing device 210, by being insulated by the sidewall dielectric 226.

However, according to various embodiments, since the device is designed such that there is a potential difference between the source and the drain terminals of the transfer transistor Tx, full dumping or transfer of the photo charge(s) can be achieved.

Furthermore, according to one exemplary embodiment, a charge connection region is formed between the photodiode and the readout circuitry to provide a swift movement path for the photo charge(s), so that a dark current source is minimized, while preventing deterioration of saturation and sensitivity. This alternative embodiment has a first conductivity type connection region 148 formed at one side of the electrical junction area 140. According to this alternative embodiment, the N+ connection region 148 for an ohmic contact can be formed adjacent to and/or in contact with the P0/N−/P− junction 140. Here, a process of forming the N+ connection region 148 and an M1C contact 151*a* may provide a leakage source because the device operates with a reverse bias applied to the P0/N−/P− junction 140 and so an electric field EF can be generated on the Si surface. A crystal defect generated in the P0/N−/P− junction 140 during the contact forming process inside the electric field may serve as a leakage source. In addition, in the case where the N+ connection region 148 is formed on the surface of the P0/N−/P− junction 140, an electric field due to the N+/P0 junction 148/145 is added, and this may also result in current leakage.

Therefore, this alternative embodiment concerns a layout in which a first contact plug 151*a* is formed in an active region including the N+ connection region 148, which does not include a P0 layer thereon. The first contact plug 151*a* may be connected directly with the N-junction 143 (e.g., through a silicide layer formed by annealing a lowermost metal in the contact plug 151*a*, such as titanium or tantalum, and the silicon in the heavily-doped first conductivity type region (e.g., N+ connection region 148). Accordingly, generation of the electric field on the Si surface may be restrained, thereby reducing the dark current in a 3D integrated CIS.

As apparent from the above description, in accordance with various embodiments of the present image sensor and manufacturing method thereof, electrical shorts may be prevented from occurring at a contact plug connecting readout circuitry with an image sensing device by insulating the contact plug penetrating the image sensing device with a sidewall dielectric.

Also, since the device is designed such that there is a potential difference between the source and drain of a transfer transistor Tx, full dumping or transfer of photo charge(s) can be achieved.

Furthermore, a charge connection region may be formed between a photodiode and the readout circuitry to provide a swift movement path for the photo charge(s). Therefore, one or more sources of dark current may be minimized while preventing deterioration of saturation and sensitivity.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for manufacturing an image sensor, comprising:
    forming readout circuitry on a first substrate;
    forming a first dielectric layer on the first substrate, and a metal line in or on the first dielectric layer in electric connection with the readout circuitry;
    forming a second dielectric layer on the metal line;
    forming an image sensing device on the second dielectric layer, including a first conductivity type ohmic contact layer, a first conductivity type conduction layer, and a second conductivity type conduction layer, the first conductivity type conduction layer having a greater thickness than the second conductivity type conduction layer;
    forming a first via hole through the second conductivity type conduction layer;
    forming a sidewall dielectric in the first via hole on a sidewall of the second conductivity type conduction layer;
    forming a second via hole at a bottom of the first via hole, exposing the metal line, using the sidewall dielectric as an etching mask;
    forming a contact plug in the second via hole to connect the first conductivity type conduction layer with the metal line; and
    forming an interpixel dielectric through the image sensing device and the first conductivity type conduction layer.

2. The method according to claim 1, wherein forming the sidewall dielectric on the sidewall of the second conductivity type conduction layer includes:
    forming a dielectric layer on the first dielectric layer and in the first via hole; and
    anisotropically etching the dielectric layer.

3. The method according to claim 1, further comprising, after the forming the contact plug:
    forming a third via hole by removing an uppermost part of the contact plug; and
    forming a third dielectric layer in the third via hole.

4. The method according to claim 3, wherein the third dielectric layer comprises an oxide layer.

5. The method of claim 3, wherein forming the third via hole comprises anisotropically etching the uppermost part of the contact plug.

6. The method according to claim 1, further comprising, after forming the contact plug:
    removing contact plug material on an uppermost surface of the image sensing device; and
    forming a third dielectric layer on the contact plug.

7. The method according to claim 1, further comprising forming an electrical junction area in the first substrate electrically connected with the readout circuitry.

8. The method according to claim 7, wherein the readout circuitry has a potential difference between a source and a drain of a transistor.

9. The method according to claim 7, wherein forming the electrical junction area comprises:
    forming a first conductivity type ion implantation region in the first substrate; and
    forming a second conductivity type ion implantation region on the first conductivity type ion implantation region.

10. The method according to claim 9, further comprising:
    forming a first conductivity type connection region between the electrical junction area and the metal line.

11. The method according to claim 10, wherein the first conductivity type connection region is electrically connected with the metal line at an uppermost part of the electrical junction area.

12. The method according to claim 10, wherein the first conductivity type connection region is electrically connected with the metal line at one side of the electrical junction area.

13. The method of claim 10, wherein the first conductivity type conduction region has a depth greater than the second conductivity type ion implantation region.

14. The method of claim 9, wherein the first conductivity type connection is an N+ doping region and the electrical junction area comprises a P0/N−/P− junction for improved ohmic contact.

15. The method according to claim 1, wherein the second dielectric layer comprises an oxide layer and/or a nitride layer.

16. The method according to claim 1, wherein the metal line layer comprises a dual damascene copper interconnection.

17. The method of claim 1, wherein the image sensing device comprises a photodiode.

18. The method of claim 1, wherein the photodiode comprises the first conductivity type conduction layer and the second conductivity type conduction layer thereon, wherein the first conductivity type conduction layer comprises an N+ layer.

19. The method of claim 1, further comprising removing the second conductivity type conduction layer of the image sensing device to form the first via hole.

* * * * *